(12) United States Patent
Wang

(10) Patent No.: US 8,154,334 B2
(45) Date of Patent: Apr. 10, 2012

(54) SYSTEM AND METHOD FOR PRE-CHARGING A BOOTSTRAP CAPACITOR IN A SWITCHING REGULATOR WITH HIGH PRE-BIAS VOLTAGE

(75) Inventor: Jue Wang, Hillsborough, NJ (US)

(73) Assignee: Intersil America Inc., Milpitas, CA (US)

( * ) Notice: Subject to any disclaimer, the term of this patent is extended or adjusted under 35 U.S.C. 154(b) by 125 days.

(21) Appl. No.: 12/611,701

(22) Filed: Nov. 3, 2009

(65) Prior Publication Data

US 2011/0018613 A1 Jan. 27, 2011

Related U.S. Application Data

(60) Provisional application No. 61/227,271, filed on Jul. 21, 2009.

(51) Int. Cl.
*G05F 1/10* (2006.01)
*G05F 3/02* (2006.01)
(52) U.S. Cl. .......... 327/537; 327/536; 327/549; 363/59; 363/60
(58) Field of Classification Search .............. 327/148, 327/157, 534–537; 363/59, 60
See application file for complete search history.

(56) References Cited

U.S. PATENT DOCUMENTS

| | | | | |
|---|---|---|---|---|
| 5,365,118 A | * | 11/1994 | Wilcox | 327/109 |
| 5,373,435 A | * | 12/1994 | Jayaraman et al. | 363/98 |
| 5,514,994 A | * | 5/1996 | Sawada | 327/390 |
| 5,883,547 A | * | 3/1999 | Diazzi et al. | 327/589 |
| 6,172,493 B1 | * | 1/2001 | Grant | 323/288 |
| 6,518,733 B1 | | 2/2003 | Schenkel | |
| 6,696,867 B2 | | 2/2004 | Keeth | |
| 6,861,894 B2 | | 3/2005 | Cernea | |
| 7,091,501 B2 | | 8/2006 | Joly | |
| 7,141,955 B1 | | 11/2006 | Martinez | |
| 7,342,365 B2 | | 3/2008 | Wu | |

(Continued)

FOREIGN PATENT DOCUMENTS

JP  10-225105 A  8/1998

(Continued)

OTHER PUBLICATIONS

PCT: International Search Report and Written Opinion of PCT/US2010/042729 (related application); Feb. 25, 2011, 7 pages.

*Primary Examiner* — Lincoln Donovan
*Assistant Examiner* — Brandon S Cole
(74) *Attorney, Agent, or Firm* — Howison & Arnott, L.L.P.

(57) ABSTRACT

An apparatus comprises a voltage regulator including an high side switching transistor and a low side switching transistor. An high side drive controls operation of the high side switching transistor. A low side driver controls operation of the low side switching transistor. A bootstrap capacitor provides an operating voltage to the high side switching driver. The bootstrap capacitor is charged to a predetermined level responsive to a supply voltage. A low side driver drives the low side switching transistor according to a process that charges the bootstrap capacitor to the predetermined level. The process turns on the low side switching transistor for a first predetermined number of cycles and turns off the low side switching transistor for a second predetermined number of cycles. The process is repeated for a predetermined number of times during startup of the voltage regulator when a prebias load is applied to the voltage regulator.

15 Claims, 3 Drawing Sheets

U.S. PATENT DOCUMENTS

| | | | |
|---|---|---|---|
| 7,538,583 B2 * | 5/2009 | Bryson | 326/88 |
| 2005/0102128 A1 * | 5/2005 | Wilhelm | 703/23 |
| 2007/0236283 A1 * | 10/2007 | Locatelli et al. | 327/589 |
| 2008/0100378 A1 * | 5/2008 | Bernacchia | 327/589 |
| 2009/0201071 A1 * | 8/2009 | Jinta | 327/390 |

FOREIGN PATENT DOCUMENTS

| | | |
|---|---|---|
| KR | 10-2001-0030203 A | 4/2001 |
| KR | 10-2001-0030257 A | 4/2001 |
| WO | 2007039091 A1 | 4/2007 |

* cited by examiner

SYSTEM AND METHOD FOR PRE-CHARGING A BOOTSTRAP CAPACITOR IN A SWITCHING REGULATOR WITH HIGH PRE-BIAS VOLTAGE

CROSS-REFERENCE TO RELATED APPLICATIONS

This application claims priority to U.S. Provisional Patent Application No. 61/227,271, filed Jul. 21, 2009, entitled METHOD FOR PRE-CHARGING A BOOT CAPACITOR IN SWITCHING VOLTAGE REGULATORS WITH HIGH PRE-BIAS VOLTAGE, which is incorporated herein by reference in its entirety.

BRIEF DESCRIPTION OF THE DRAWINGS

For a more complete understanding, reference is now made to the following description taken in conjunction with the accompanying Drawings in which.

DETAILED DESCRIPTION

Figure 1:
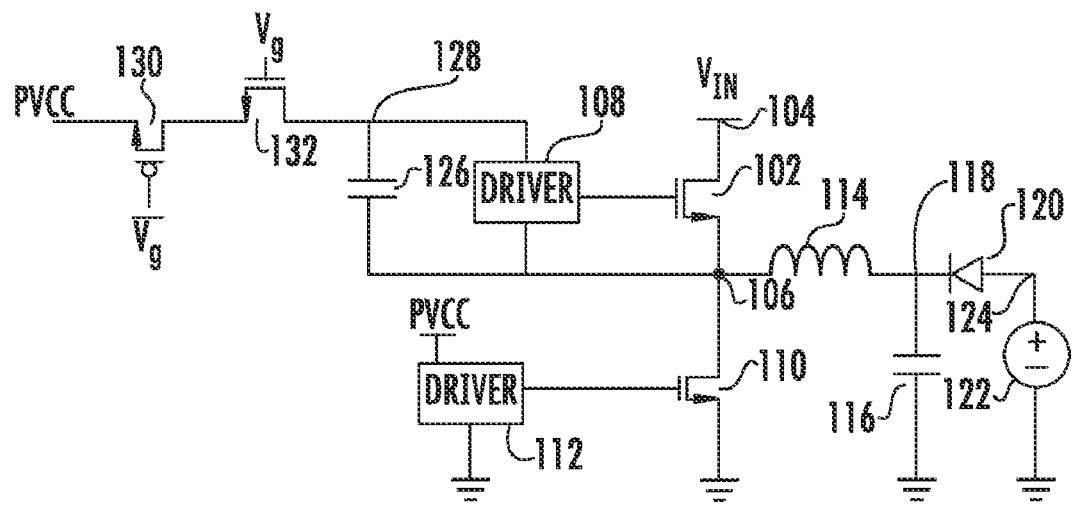
FIG. 1 is a schematic diagram of a voltage regulator including a bootstrap capacitor.

Referring now to the drawings, wherein like reference numbers are used herein to designate like elements throughout, the various views and embodiments of a system and method for pre-charging a bootstrap capacitor in a switching regulator with high pre-bias voltage are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to the drawings, and more particularly to FIG. 1, there is illustrated a schematic diagram of a voltage regulator including a bootstrap capacitor. The input voltage $V_{IN}$ is applied to an high side switching transistor 102 that is connected between the input voltage node 104 and the phase node 106. The high side switching transistor 102 comprises an N-channel transistor and has its drain/source path connected between node 104 and node 106. The gate of the high side switching transistor 102 is connected to a driver circuit 108. A low side switching transistor 110 comprises another N-channel transistor and has its drain/source path connected between node 106 and ground. The gate of low side switching transistor 110 is connected to a driver circuit 112.

An LC filter consisting of an inductor 114 and a capacitor 116 is connected between node 106 and node 118. The inductor 114 is connected between node 106 and node 118. The capacitor 116 is connected between node 118 and ground. A diode 120 has its cathode connected to node 118 and its anode connected to a pre-bias voltage source 122 at node 124.

The bootstrap capacitor 126 is connected between node 128 and the phase node 106. A supply voltage PVCC is provided to node 128 through a pair of transistor switches 130 and 132. The gate voltage $V_g$ is used for turning on transistor switches 130 and 132 to apply the supply voltage PVCC to the bootstrap capacitor 126 and the driver circuit 108 when the low side switching transistor is turned on. The bootstrap capacitor 126 is connected between the boot node 128 and the phase node 106. The bootstrap capacitor is charged by the supply voltage PVCC through switches 130 and 132. The switches 130 and 132 are integrated in order to save on board component counts. In an alternative embodiment, the switches 130 and 132 may comprise diodes. Normally, the impedance of the switches 130 and 132 is on the order of 10 ohms. Thus, for a typical bootstrap capacitor value of 0.1 microfarads a time period of greater than 3 microseconds is necessary to charge the bootstrap capacitor 126 to an operating value. If the bootstrap capacitor 126 is not charged up to a high enough operating value, start up problems and dead time shifts will occur within the voltage regulator.

The bootstrap capacitor 126 provides the supply voltage to the high side switching transistor level shifter and driver circuit 108. The level shifter within the driver circuit 108 requires enough voltage headroom in order to operate properly. The driver circuit 108 propagation delay has a strong dependence upon the supply voltage provided from the bootstrap capacitor 126. With a preset dead time scheme, a low bootstrap capacitor voltage causes negative dead time and hence a shoot through current when the regulator switches. Thus, when the upper power FET is turned on, the body diode of the high side switching transistor 102 can be destroyed by switching transients due to an extremely high current.

The bootstrap capacitor 126 is able to be charged when the phase node 106 is at a lower voltage level than the PVCC voltage applied at node 128. In a situation when there is a high pre-bias voltage 122 being applied at the load of the voltage regulator, the bootstrap capacitor 126 can only be charged up to a level equal to $PVCC-V_{pre-bias}$ before the switching transistors 102 and 110 begin switching. In order to charge the bootstrap capacitor 126 up to the voltage PVCC, the low side switching transistor 110 is turned on for greater than 3 microseconds. However, in situations where a high pre-bias voltage 122 is at the load, the inductor current through inductor 114 ramps up to a negative value rather quickly. In a worst case scenario, the inductor current may be as high as 20 amps in a 6 amp product. After the bootstrap capacitor 126 has been charged, the voltage regulator starts generating the PWM signal within the driver circuitries 108 and 112 and turns on the high side switching transistor 102. The body diode of the high side switching transistor 102 can be destroyed by switching transients due to extremely high currents within the voltage regulator caused by a high negative inductor current.

In some embodiments, the bootstrap capacitor voltage may be as low as one volt due to high pre-bias voltage. This voltage level is not sufficient to drive the driver circuit 108 and the voltage regulator will fail to start up. Thus, there is a need to charge up the bootstrap capacitor 126 to a sufficient voltage level that will enable operation of the driver circuit 108. However, as described previously, the low side switching transistor 110 must be turned on in order to charge the bootstrap capacitor 126. If this is done for too long a period of time, the negative inductor current though inductor 114 will build up to an unacceptably high level. The present solution controls the operation of the low side transistor 110 by forcing the low side switching transistor 110 on for M predetermined number of clock cycles and then off for N predetermined number of clock cycles and then repeating this process for several iterations. This occurs prior to the initiation of the PWM signal. The inductor peak current value is controlled to be under the full load current. The M and N values for the on and off times of the low side switching transistor 110 are selected to ensure the inductor current will not build up to too high a value according to the input voltage range and output voltage ranges.

In one embodiment, the low side switching transistor 110 may be forced on for two cycles and then forced off for three cycles. This process would be repeated 5 times. Ultimately, this process would have the low side switching transistor 110 turned on for a total of 6 microseconds in order to charge the bootstrap capacitor 126. At the same time, the low side switching transistor is turned on, the high side switching transistor remains off. By turning on and off the low side switching transistor 110, the bootstrap capacitor 126 is steadily charged up to a necessary operating voltage level. However, as the negative inductor current increases during the on times, the off times of the low side switching transistor 110 enabled the negative inductor current to decay to zero. This can be repeated for several cycles until the bootstrap capacitor voltage rises to a sufficient level and the inductor current may be maintained at a sufficiently close to zero without reaching a high negative level.

By holding the low side switching transistor off prior to generation of initiation of the PWM signal, a number of problems are overcome. With a high pre-bias load if the low side switching transistor is turned on before the controller has reached an appropriate state, the output capacitor is discharged and causes a big drop in the output voltage. This type of performance is not allowed according to various product specifications. When discharging the output capacitor the inductor current also builds up due to the high pre-bias voltage and could be as high as 100 amps. By turning the low side switching transistor on for N cycles and off for M cycles and repeating this process prior to PWM startup, the inductor current is prevented from building up to too high of a value. The off state of the low side switching transistor 110 allows the inductor current to return to zero from its negative inductor current value. The low side switching transistor 110 may then be turned on again.

Figure 2:
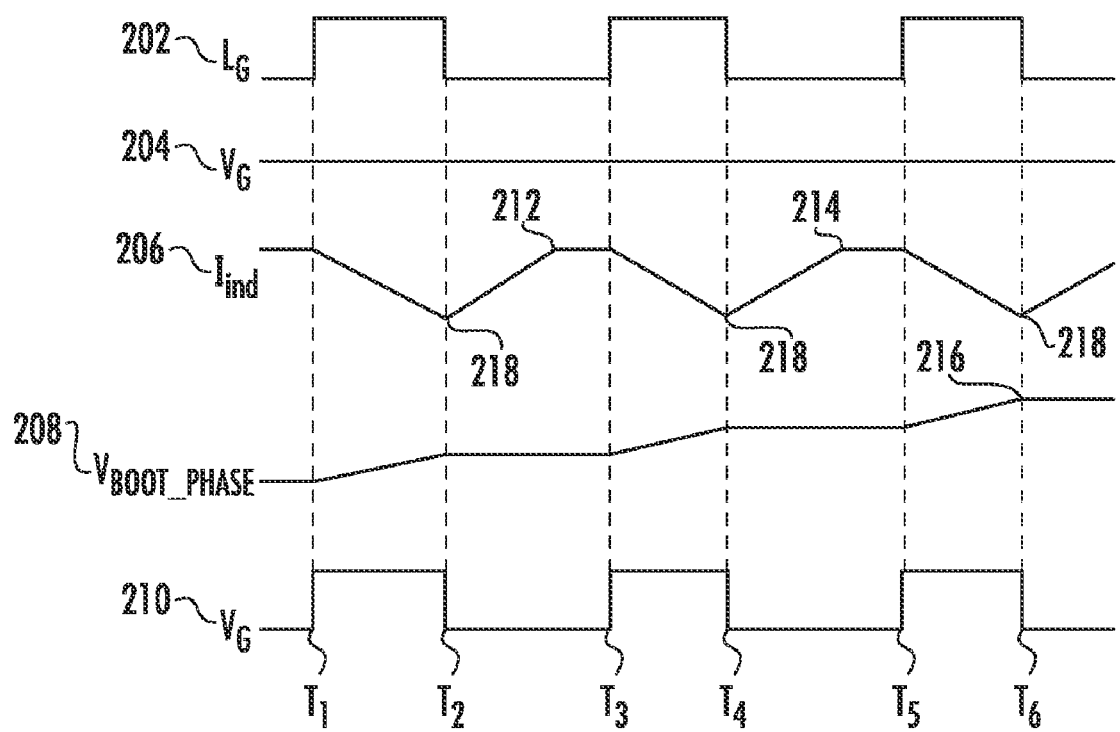
FIG. 2 is an illustration of the various voltage and current signals within the voltage regulator of FIG. 1.

Referring now to FIG. 2, there are illustrated the various waveforms associated with the voltages and currents for charging the bootstrap capacitor 126. The LG signal 202 represents the low side voltage and indicates when the low side switching transistor 110 is turned on and off. The LG signal 202 turns on the transistor 110 when it is at a logical "high" level and turns off the transistor 110 when it is at a logical "low" level. The UG signal 204 represents the gate voltage applied to the high side switching transistor 102. As can be seen, over the time that the bootstrap capacitor 126 is being charged, the high side switching transistor 102 remains off and the UG signal 204 remains at a logical "low" level to maintain the gate off. $I_{ind}$ 206 represents the inductor current through inductor 114. The boot phase voltage 208 represents the capacitor voltage on the bootstrap capacitor 126. The voltage signal $V_g$ represents the voltage that is applied to transistor switches 130 and 132 to connect the supply voltage PVCC to the bootstrap capacitor 126 and driver 108. The voltage $V_g$ 210 turns on the transistor switches 130 and 132 when it is at a logical "high" level enabling connection of the PVCC voltage to the bootstrap capacitor 126 and driver 128 and is at a logical "low" level to disconnect PVCC from these components.

A charging cycle of the bootstrap capacitor 126 can be seen over the range of time from time $T_1$ to time $T_6$. The process is initiated at time $T_1$ when the LG signal 202 and the voltage $V_g$ 210 both go from a logical "low" level to a logical "high" level. These voltages remain at a logical "high" level from time $T_1$ to time $T_2$ when they then both go back to a logical "low" level. During the time period from time $T_1$ to time $T_2$, the boot phase voltage 208 begins to increase. At the same time the boot phase voltage 208 is increasing, the negative inductor current becomes more negative from time $T_1$ to time $T_2$. In the next portion, from time $T_2$ to $T_3$, the low side voltage LG 202 and $V_g$ voltage 210 go to a logical "low" level turning off transistor 110. While the low side switching transistor 110 is turned off, the bootstrap capacitor voltage 126 remains relatively stable from time $T_2$ to time $T_3$ or may decay slightly. At the same time, the inductor current 206 transitions from its low negative value back toward a zero inductor current which it reaches at point 212. The inductor current then remains at zero until time $T_3$.

At time $T_3$, the LG signal 202 and $V_g$ voltage 210 again go to a logical "high" level which repeats the process. The boot phase voltage 208 will increase from time $T_3$ to time $T_4$ when the LG signal 202 is again turned off and the inductor current increases from a zero value at time $T_3$ to a negative value at time $T_4$. When the LG signal 202 is again turned off, the boot phase voltage 208 will remain relatively stable from time $T_4$ to $T_5$ and the inductor current 206 will decay back toward a zero value from its negative value to point 214. This process will continue until the bootstrap capacitor voltage is charged up to a desired level at time $T_6$ at point 216. In this manner, the boot phase voltage 208 increases from this level at time $T_1$ to a maximum level at time $T_6$ while the inductor current 206, while changing between zero and a maximum negative value at 218, will not increase to a level that adversely affects operation of the voltage regulator when the PWM signal is initiated.

Figure 3:
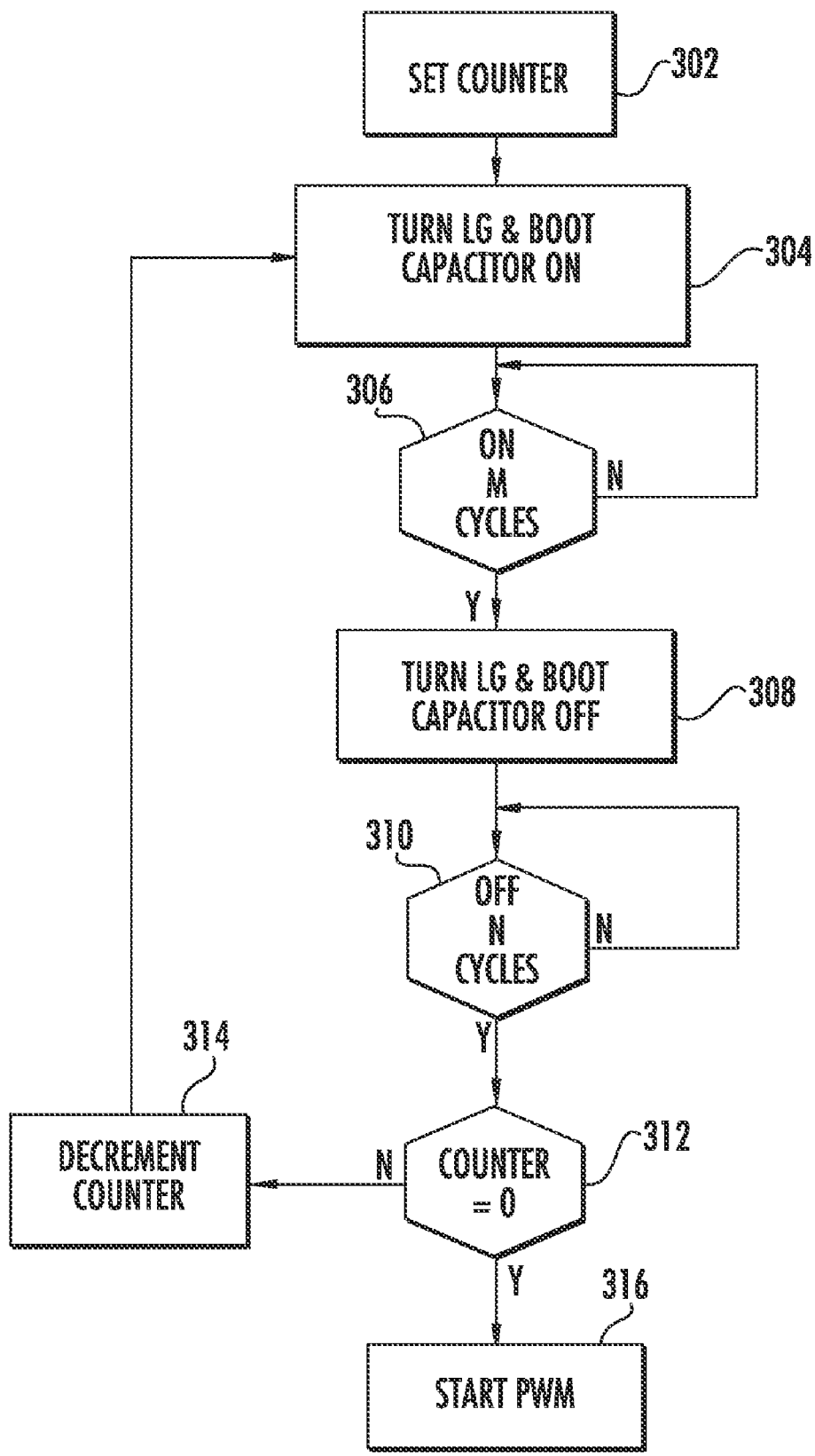
FIG. 3 is a flow diagram describing the operation for charging the bootstrap capacitor in a voltage regulator having a high pre-bias voltage.

Referring now to FIG. 3, there is illustrated a flow diagram describing the operation of the high side switching transistor 102 and low side switching transistor 110 for pre charging the bootstrap capacitor prior to generation of the PWM signal. Initially, at step 302, a counter is set to a predetermined value. This predetermined value represents the number of times that the on/off sequence for the low side switching transistor 110 will occur. Next, the low side switching transistor and the $V_g$ voltage applied to the bootstrap capacitor are turned on at step 304. This begins a process of charging the bootstrap capacitor 126, and the negative current of the inductor 114 begins increasing. Inquiry step 306 determines if the low side switching transistor 110 has been turned on for M cycles, where M is the predetermined number of clock cycles that has been established for turning on the low side switching transistor. If not, inquiry step 306 continues to monitor the number of cycles and once the low side switching transistor 110 has been turned on for M cycles, the low side switching transistor and bootstrap capacitor supply voltage signal $V_g$ are turned off at step 308.

Inquiry step 310 determines whether the low side switching transistor 110 has been off for N cycles, where N is the number of cycles that has been previously established. If not, inquiry step 310 continues monitoring the number of cycles and once it is determined that the low side switching transistor 110 has been turned off for N cycles, inquiry step 312 determines whether the counter value is equal to zero. If not, the on/off cycle of the low side switching transistor 110 has not occurred a sufficient number of time, control passes to step 314 where the counter is decremented by one and then to step 304 where the low side switching transistor 110 and $V_g$ bootstrap capacitor voltage are again turned on. If inquiry step 312 determines that the counter value does equal to zero, the bootstrap capacitor has charged to a sufficient voltage level, and the PWM signal may be initiated at step 316.

Figure 4:
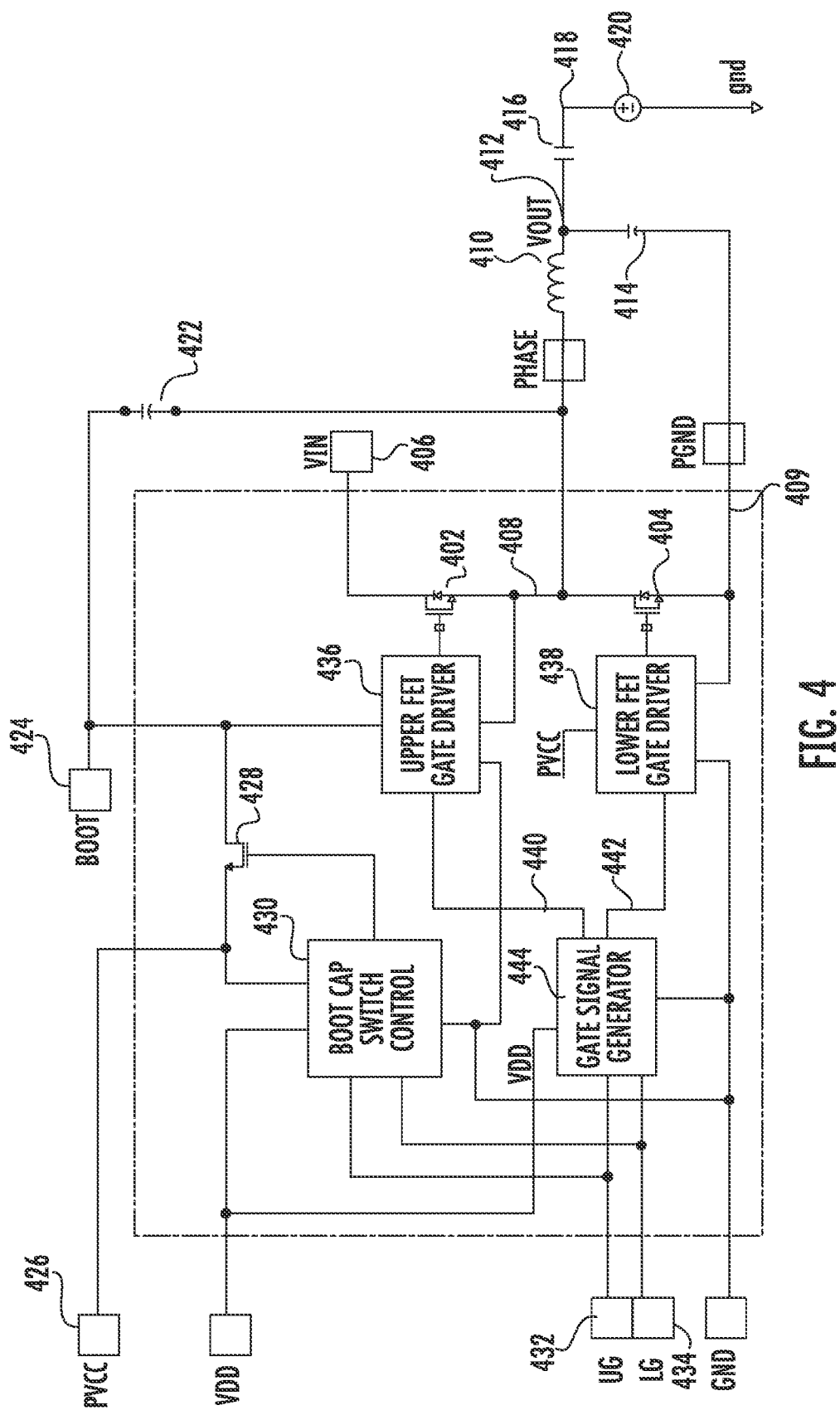
FIG. 4 is a schematic block diagram more fully illustrating the circuitry for pre charging the bootstrap capacitor in a voltage regulator having a high pre-bias voltage.

Referring now to FIG. 4, there is illustrated a further schematic block diagram of the bootstrap capacitor charging scheme of the present disclosure. In this embodiment, the input voltage $V_{IN}$ is applied to a pair of switching transistors 402 and 404 at node 406. The N-channel transistor 402 comprises the high side switching transistor and is connected between node 406 and phase node 408. The low side switching transistor 404 comprises another N-channel transistor and is connected between phase node 408 and ground node 409. The inductor 410 is connected between node 408 and the output voltage node 412. A capacitor 414 is connected between node 412 and the ground node 409. Diode 416 has its cathode connected to node 412 and its anode connected to node 418. The pre-bias voltage is applied at node 418. The pre-bias voltage is connected between node 418 and ground.

The bootstrap capacitor 422 is connected between the boot node 424 and the phase node 408. The supply voltage PVCC is applied at node 426. The PVCC voltage is applied to the bootstrap capacitor 422 through an N-channel transistor 428 having its source/drain path connected between node 426 and node 424. The transistor 428 acts as a switch to connect PVCC to the bootstrap capacitor 422 responsive to control signals from the bootstrap capacitor switch control block 430. The bootstrap capacitor switch control block 430 also receives input from the high side voltage control signal at node 432 and low side voltage control signal at node 434. The high side switching transistor 402 has its gate connected to upper FET gate driver 436. Similarly, the low side switching transistor 404 has its gate connected to the lower FET gate driver 436. Both the upper FET gate driver 436 and lower FET gate driver 438 are connected to receive control signals via lines 440 and 442 from the gate signal generator 444. The gate signal generator 444 assists in generating the gate drive signals responsive to the high side control signal received at node 432 and the low side control signal received at node 434. The operation of the low side switching transistor 404 in a pre charging mode responsive to a high bias voltage from the bias voltage 420 would operate in a manner similar to that discussed previously with respect to FIGS. 1-3.

It will be appreciated by those skilled in the art having the benefit of this disclosure that this system and method for pre-charging a bootstrap capacitor in a switching regulator with high pre-bias voltage provides the ability to change the bootstrap capacitor to a sufficient level to avoid damages or operational failure of the voltage regulator. By turning on and off the low side switching transistor, a predetermined number of times, the bootstrap capacitor may be charged up to a desired voltage level. The charging of the bootstrap capacitor does not increase the negative inductor currents to a level that adversely affects the operation of the associated voltage regulator while still providing the necessary operating voltage for the gate driver circuitries that are powered by the bootstrap capacitor. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. An apparatus, comprising:
    a voltage regulator including an high side switching transistor and a low side switching transistor;
    a high side driver for controlling operation of the high side switching transistor;
    a low side driver for controlling operation of the low side switching transistor;
    a bootstrap capacitor for providing an operating voltage to the high side driver, the bootstrap capacitor charged to a predetermined level responsive to a supply voltage prior to application of a PWM control signal to the high side driver and the low side driver; and
    wherein the low side driver drives the low side switching transistor according to a process that charges the bootstrap capacitor to the predetermined level prior to application of the PWM control signal to the high side driver and the low side driver, the process maintaining the high side switching transistor in an off state and turning on the low side switching transistor for a first predetermined number of cycles and turning off the low side switching transistor for a second predetermined number of cycles and repeating the process for predetermined number of times during startup of the voltage regulator when a prebias load is applied to the voltage regulator until the bootstrap capacitor is charged to the predetermined level.

2. The apparatus of claim 1, wherein a voltage on the bootstrap capacitor increases and a magnitude of a negative inductor current of the voltage regulator increases when the low side switching transistor is turned on and the magnitude of the negative inductor current of the voltage regulator decreases when the low side switching transistor is turned off.

3. The apparatus of claim 1, further including a switching circuit for connecting the supply voltage to the bootstrap capacitor when the low side switching transistor is turned on.

4. The apparatus of claim 3, wherein the switching circuit further comprises:
    at least one switching circuit responsive to at least one switching control signal; and
    a bootstrap capacitor switching control block for generating the at least one switching control signal.

5. The apparatus of claim 1, wherein the voltage regulator does not generate a PWM signal until the bootstrap capacitor has been charged to the predetermined level.

6. The apparatus of claim 1, wherein the voltage regulator further comprises:
    an inductor connected at a phase node between the high side switching transistor and the low side switching transistor and an output voltage node; and
    a capacitor connected between the output voltage node and ground.

7. An apparatus, comprising:
    a voltage regulator including high side switching circuitry, low side switching circuitry and a bootstrap capacitor for providing an operating voltage to the high side switching circuitry; and
    wherein the voltage regular includes a startup mode of operation to charge the bootstrap capacitor to a predetermined level by maintaining the high side switching transistor in an off state and turning on the low side switching circuitry for a first predetermined number of cycles and turning off the low side switching circuitry for a second predetermined number of cycles and repeating the process of turning on and off the low side switching circuitry for a predetermined number of times during startup of the voltage regulator when a prebias load is applied to the voltage regulator prior to application of a PWM control signal within the voltage regulator.

8. The apparatus of claim 7, wherein a voltage on the bootstrap capacitor increases and a magnitude of a negative inductor current of the voltage regulator increases when the low side switching circuitry is turned on and the magnitude of the negative inductor current of the voltage regulator decreases when the low side switching circuitry is turned off 9. The apparatus of claim 7, further including a switching circuit for connecting a supply voltage to the bootstrap capacitor when the low side switching circuitry is turned on.

10. The apparatus of claim 7, wherein the voltage regulator generates a PWM signal in a post startup mode of operation after the bootstrap capacitor has been charged to the predetermined level.

11. A method for charging a bootstrap capacitor in a voltage regulator, comprising the steps of:
  a) initiating a startup process for the voltage regulator when a prebias load is applied to the voltage regulator prior to application of a PWM control signal;
  b) maintaining a high side switching transistor in an off state during the start up process;
  c) turning on a low side switching transistor for a first predetermined number of clock cycles during the start up process;
  d) turning off the low side switching transistor for a second predetermined number of clock cycles during the start up process;
  e) repeating steps c)-d) for a predetermined number of times to charge the bootstrap capacitor to a predetermined voltage level while maintaining a negative inductor current in a predetermined range;
  f) applying the PWM control signal to drive the high side transistor and low side transistor after the bootstrap capacitor reaches the predetermined voltage level.

12. The method of claim 11, wherein the step of turning on the low side switching transistor further comprises the steps of:
  increasing a voltage on the bootstrap capacitor responsive to the low side switching transistor being turned on; and
  increasing a magnitude of the negative inductor current of the voltage regulator when the low side switching transistor is turned on.

13. The method of claim 11, wherein the step of turning off the low side switching transistor further comprises the steps of decreasing the magnitude of the negative inductor current of the voltage regulator when the low side switching transistor is turned off.

14. The method of claim 11, further including the step of connecting a supply voltage to the bootstrap capacitor when the low side switching transistor is turned on.

15. The method of claim 11, further including the step of generating a PWM signal after the bootstrap capacitor has been charged to the predetermined level.

* * * * *